United States Patent [19]

Liedke et al.

[11] Patent Number: 5,192,582
[45] Date of Patent: Mar. 9, 1993

[54] PROCEDURE FOR PROCESSING JOINTS TO BE SOLDERED

[75] Inventors: Volker Liedke, Elsenfeld/Eichelsbach; Karl H. Grasmann, Stadprozelten; Hans-Jurgen Albrecht, Berlin; Harald Wittrich, Berlin; Wilfred John, Berlin; Wolfgang Scheel, Berlin, all of Fed. Rep. of Germany

[73] Assignee: WLS Karl-Heinz Grasmann Weichlötanlagen-und Service, Faulbach/Main, Fed. Rep. of Germany

[21] Appl. No.: 609,400

[22] Filed: Nov. 5, 1990

[30] Foreign Application Priority Data

Nov. 6, 1989 [DE] Fed. Rep. of Germany ....... 3936955
Oct. 11, 1990 [DE] Fed. Rep. of Germany ....... 4032328

[51] Int. Cl.$^5$ ............................................. C23C 26/00
[52] U.S. Cl. ..................................... 228/206; 228/205; 427/96; 427/534; 118/50; 118/623
[58] Field of Search ............... 427/96, 38; 118/50, 118/623; 228/205, 206

[56] References Cited

U.S. PATENT DOCUMENTS

| | | | |
|---|---|---|---|
| 3,592,992 | 7/1971 | Costello | 219/85.13 |
| 4,208,159 | 6/1980 | Uehara | 118/50 |
| 4,383,494 | 5/1983 | Schillke | 118/50 |
| 4,887,762 | 12/1989 | Baker | 427/96 |
| 4,921,157 | 5/1990 | Dishon | 204/170 |

Primary Examiner—Michael Lusignan
Assistant Examiner—Vi Duong Dang
Attorney, Agent, or Firm—Roth & Goldman

[57] ABSTRACT

The invention is directed to a procedure for processing joints to be soldered, preferably printed circuit boards fitted with electric components, and an arrangement for executing this procedure, wherein the joints are subjected to plasma treatment before the soldering process. The joints may be subjected to plasma treatment separately or in the relative position necessary for the soldering process.

41 Claims, 3 Drawing Sheets

FIG. 2

PROCEDURE FOR PROCESSING JOINTS TO BE SOLDERED

DESCRIPTION The invention relates to a procedure for processing joints to be soldered and an arrangement for executing the procedure.

The procedure according to the invention is preferably used as part of a soldering process, and will also be explained as part of a soldering process in the following. However, the procedure according to the invention is not limited to a soldering process, but may also be used for pretreating and processing joints to be soldered in an ensuing soldering process. The soldering process itself and the pretreatment procedure according to the invention may be executed separately from each other in terms of space and time.

With the increasing automation of manufacturing techniques in the electronics industry, soldering processes are becoming more and more important. In the previously known processing methods, the joints, e.g. pluggable printed-board assembly components, printed circuit boards fitted with electric components or, more precisely, their metallic soldering terminals to be soldered together, were wetted with a fluxing agent, placed in a predetermined position relative to each other and then relayed to a soldering arrangement, in which the actual soldering process takes place. Exposure to the fluxing agent increases the solderability of the contact or soldering terminal surfaces, i.e. the binding forces within the first joint/solder or solder/second joint boundary surfaces. In addition, fluxing agents make it possible to increase the surface tension of the solder, so as to avoid bridge formation between two adjacent soldering joints. The fluxing agents or fluxing agent residues necessary for the joints must be removed after soldering, since they detract from the electric function of the joints and can act on them in a corrosive manner. After the soldering process, the joints soldered to each other are therefore usually passed through a wet-chemical FCKW chlorofluorocarbon or CKW chlorohydrocarbon cleansing beth in which the fluxing agent residues are eliminated.

International efforts aimed at limiting the burden placed on the environment by FCKW or CKW-containing fluids have resulted in high investments in cleaning the exhaust air and sewage, which make such soldering processes much more expensive.

The object of the invention is to develop a procedure for processing joints to be soldered to each other and an arrangement for executing this procedure, which make it possible to largely reduce the amount of fluxing agent necessary for processing the joints.

The plasma pretreatment according to the invention, i.e. the exposure to a process gas converted into an ionized state by applying a high-frequency alternating voltage, pickles passive and oxide layers on the surfaces of the joints, safeguards against repeated contamination, and hence provides metallurgically reactive surfaces for the soldering process. Therefore, the plasma pretreatment makes it possible to increase the solderability of the joints without using fluxing agents, thereby enabling the use of fluxing agents with a lower content of solids or eliminating their necessity altogether. The plasma pretreatment also permits a fluxing agent-free processing of printed circuit boards, which eliminates the need for the wet-chemical cleansing process for removing the fluxing agent and makes production considerably less expensive and cleaner. In comparison to wet-chemical procedures, using a process gas makes it easy to monitor the process. This makes it easy to control even environmentally hazardous substances, since the process gases are circulated in a closed system, and harmful substances may be readily removed, e.g. by an adsorber. Various process gases may be used and, with some of them the surface of the joints is preferably pickled by reducing the passive and oxide layers on the metal surfaces, while the solderability of the joints using other process gas compositions is essentially based on an oxidizing effect of the process gas. The process gas is selected depending on the manufacturing conditions by the type and quantity of passive and oxide layers.

Using a low-pressure plasma enables the treatment of printed circuit boards at low process temperatures, thereby preventing heat damage to the joints.

The joints are advantageously fixed into position before plasma treatment.

The separate or assembled joints may be temporarily stored in gas-tight receptacles, e.g. bags, containers etc., with the receptacle preferably having a protective gas atmosphere inside, or at least an atmosphere largely free of $O_2$. Using $N_2$ as the protective gas passivates the active centers of the joints through nitride formation, which suppresses an ensuing contamination. This makes it possible to subject the joints to plasma treatment at the production or assembly site already and introduce them into the receptacle (e.g., by welding in a plastic bag under a protective gas atmosphere). The receptacle can simultaneously be used as a transport box. In this way, the joints treated independently of the actual soldering process in terms of location and time may be subjected to continued treatment using conventional or slightly modified soldering arrangements.

Thermostating arrangements may be provided in the temporary storage tanks in order to make preparations for the next manufacturing step.

The manufacturing procedure may be one in which the joints are soldered to each other in the soldering process which follows plasma treatment almost immediately, so that plasma pretreatment is closely tied to the soldering process in terms of location and time, or one in which the joints are temporarily stored after plasma treatment, preferably in a protective gas atmosphere.

The joints can be treated with a protective gas to prevent reoxidation between the plasma treatment and ensuing soldering process.

At low batch sizes, use may be made of a closed plasma process chamber operated in stages, which may be easily adjusted to various operating conditions and joint geometries.

During mass production, the plasma treatment is preferably executed in a continuously operated process chamber.

The claimed procedure may preferably be used for soldering electronic components with printed circuit boards.

The procedure may be used to particular advantage for SMD or mixed COB/SMD component set modules when the components are fixed into position on the printed circuit boards.

One particularly economical procedure involves the simultaneous plasma treatment of numerous joints.

The arrangement disclosed makes it possible to execute the procedure, wherein a low-pressure process chamber known in the art may advantageously be used for plasma treatment. The soldering arrangements existing today may be retrofitted for production with little or no flux agent using such an arrangement.

The claimed procedure may preferably be used for soldering electronic components with printed circuit boards.

Temporary storage tanks which temporarily store the joints before and/or after plasma treatment are preferably allocated to the process chamber.

Locking the process chamber and temporary storage tank with one lock system each enables a constant plasma treatment of the joints in a continuous system.

The use of numerous high-frequency generators advantageously spaced in parallel to the lower and/or upper large surfaces of the joints for generating gas plasma ensures a uniform distribution of the gas plasma over the surface of the joints.

It is also possible to adjust the first and second temporary storage tanks to the environmental conditions or operating conditions of the process chamber, wherein it is particularly advantageous if the temporary storage tanks may be ventilated with a protective gas.

The aforementioned components or a combination of these components into a compact total system which ensures an economic soldering of joints, in particular of printed board assemblies. Arranging at least the plasma treatment chamber and soldering arrangement in a shared through tunnel system ensures that the printed board assemblies treated with plasma will be fed to the soldering arrangement without reoxidizing the soldering terminal surfaces at a minimal outlay with respect to the process and equipment.

Forming a relaxation zone inside the plasma chamber at the inlet and outlet makes it possible to significantly reduce the influence of opening the lock gates on the composition of the gas in the plasma chamber, and the printed circuit boards may be heated to the process temperature in the relaxation zones.

The invention may be used in conjunction with a wave soldering arrangement or reflow soldering arrangement, so that both mixed component sets with conventional components and SMDs (wave soldering arrangement) and purely SMD component sets (reflow soldering arrangement) may be continuously processed.

In the following, the invention will be described in greater detail based on preferred embodiments, referring to the figures. Shown on.

Among other areas, the procedure may be used for the flux agent-free or reduced soldering of SMD (surface mounted device) components and COB (chip on board) or THM (through hole mounted) components on pluggable printed-board assemblies, e.g. printed circuit boards.

Before discussing embodiments of the invention, the physicochemical circumstances involved in plasma pretreatment will be touched upon in brief below.

The soldering terminal surfaces contained in Sn, Pb, Cu, Ag, Pd, Ni, Au or alloys thereof are pickled during plasma pretreatment, which significantly increases the solderability of the joints.

The reaction mechanism during the pickling of metallic surfaces carrying an organic contamination layer may be described as follows when using an $H_2/CH_4$ process gas.

The metallic surfaces are coated with hydrocarbon polymers ($C_xH_y$). Active hydrogen reduces the polymers to methyl radicals and thereby removes the polymer from the metal surfaces or metal oxide surfaces. The active hydrogen reduces the metal oxides to metal:

$$MeO_x + 2xH^* \rightarrow Me + xH_2 + xH_2O \uparrow;$$

In addition to active hydrogen species, the $H_2/CH_4$ plasma contains active methyl radicals, which trigger the removal of the metal surface (the forming metal alkyls are volatile).

$$Me + X \rightarrow CH_3^* \rightarrow Me(CH_3)_x \uparrow;$$

Combining the reduction and alkylation reactions triggers the removal of both organic and oxidic and metallic surface films, and hence a cleaning process.

Figure 1:
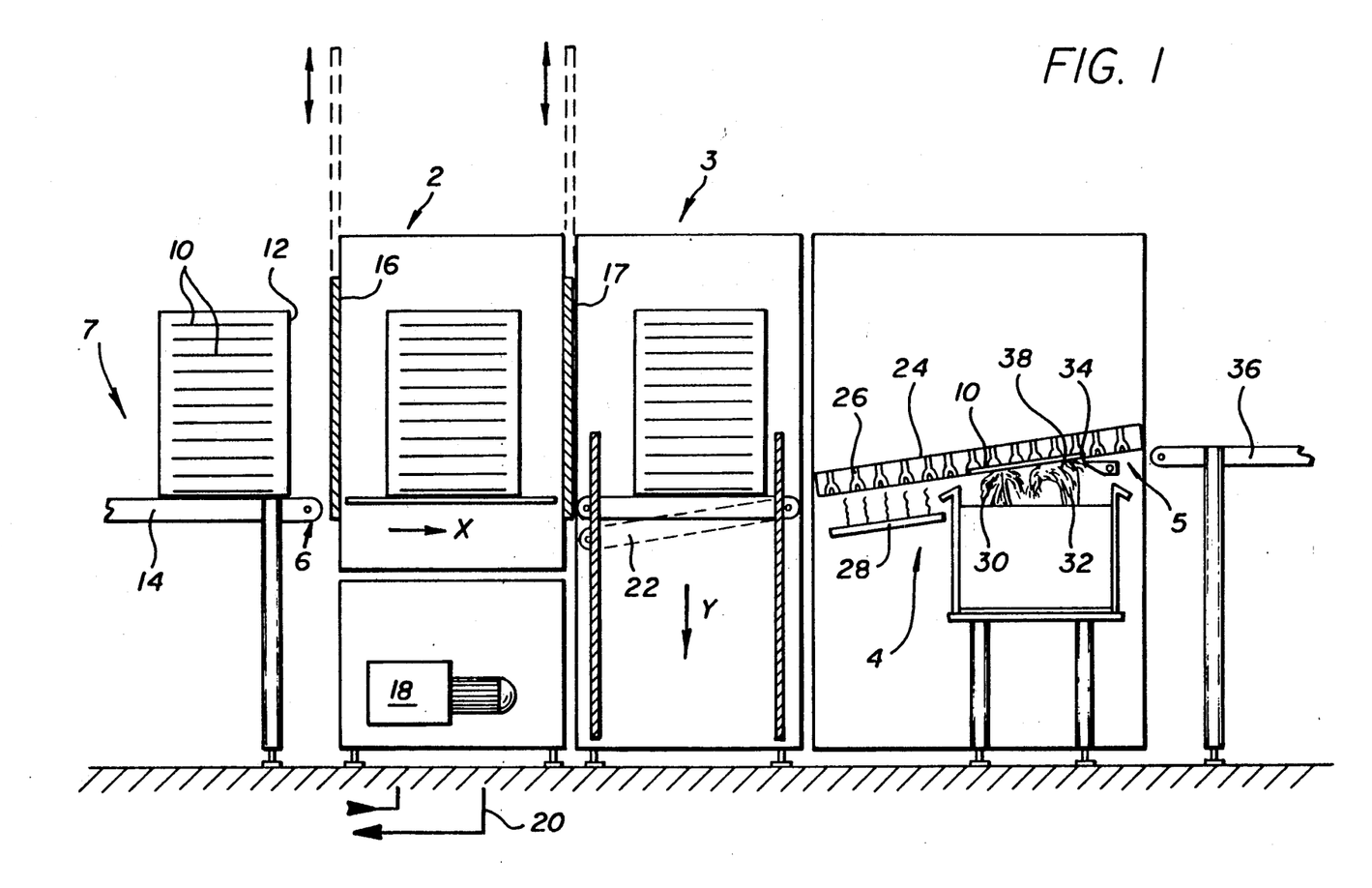
FIG. 1 is a first embodiment of an arrangement for processing printed circuit boards fitted with electronic components.

The arrangement shown on FIG. 1 has a feed station 1, a low-pressure process chamber 2, a heatable temporary storage tank 3 and a soldering arrangement 4, e.g. a wave soldering arrangement, which has a protecting gas inflating station 5. The above processing stations are connected by a conveying system 6, which enables largely automated production. The components of conveying system 6 will not be described concretely below, since these are already known in the art from conventional soldering arrangements. Since the entire described system is composed of individual modules already existing, conventional soldering arrangements may easily be expanded, for example through the allocation of process chamber 2 and temporary storage tank 3.

A predetermined number of printed circuit boards 10 assembled in an automatic component insertion machine (not shown) is arranged in a stack magazine 12, which is fed to process chamber 2 by means of a feed belt 14. conventional low-pressure process chambers may be used for the plasma procedure. Such process chambers are available with a volume of from 10 liters (laboratory scale) to several m³ (industrial scale). Since low-pressure process chambers are already sufficiently known, e.g. in plastic painting technology for pretreating plastic surface to be painted, only the components important for an understanding of the desired arrangement will be described below. Low-pressure process chamber 2 may be closed by two chamber doors 16 and 17. However, the process chamber may also be sealed vacuum-tight by two locks arranged in transport direction X, which is also preferred. The inside of quartz-lined process chamber 2 may be evacuated to the preset process pressure by means of a vacuum pump 18. Vacuum pump 18 is designed in such a way that the inside of process chamber 2 may be brought to the process pressure in less than 2 min. Lines 20 for carrying the process gases in and out are connected to process chamber 2. The exhausted process gases are subjected to a gas cleansing step (not shown), e.g. by means of an adsorber, so that any environmentally hazardous reaction products may be removed from the circulating process gas.

Process chamber 2 has a high-frequency generator called a magnetron (not shown), which may be used to bring the process gas into an ionized state (plasma).

Process chamber 2 is followed by a heatable temporary storage tank 3, into which stack magazine 12 may be transferred from process chamber 2 by means of a transport arrangement (not shown). Temporary storage tank 3 is heated by an auxiliary heating system to a temperature suited for the ensuing soldering process.

Printed circuit boards 10 are individually removed from stack magazine 12 one after the other by means of a dispenser 22, during which the stack of printed circuit boards may be lowered in the Y direction, thereby bringing the respective printed circuit board 10 to be removed to the height of the conveying surface plane. Dispenser 22 may also be designed as a handling device equipped with a printed circuit board gripper, thus eliminating the necessity of lowering stack magazine 12. The capacity of stack magazine 12 and duration of plasma pretreatment cycles are selected in such a way as to ensure a continuous supply of printed circuit boards 10 to the soldering machine.

Dispenser 22 is followed by a conveyor belt 24, which is equipped with receptacles 26 for fixing printed circuit boards 10 into position, or with an auxiliary frame (not shown), which holds printed circuit boards 10. Along with the SMDs and connection elements of the conventional components in the figure, the printed circuit board to be soldered is arranged in such a way that it points downward, so that the soldering joints are wetted in soldering machine 4. Conveyor belt 24 is set up at a preset angle of approx. 7° relative to the horizontal line. A preheating system 28 for pretreating printed circuit boards 10, e.g. one operated with infrared elements, is arranged parallel to the initial section of conveyor belt 24.

Preheating system 28 is followed by a double-wave soldering arrangement 4 known in the art. Such a soldering arrangement 4 operates with two soldering waves 30, 32, wherein a turbulent flow is formed in the first wave 30 viewed in transport direction X. This flow completely wets the soldering joints, since the various flows within wave 30 also force the solder to stream against transport direction X of the printed circuit board. In the second wave 32, the solder streams against transport direction X in a laminar flow, during which unnecessary portions of the solder are removed from the soldering joint.

A protective gas such as $N_2$ is blown into the gap between the second soldering wave 32 and newly wetted section of the printed board assembly by means of a slit die 34 extending over the width of the solder wave. The temperature of this protective gas lies below the soldering liquidus point, so that a protective gas zone forms directly after the second wave 32 which does not influence the laminar flow of the wave.

The final station in this embodiment consists of an arrangement 36 for carrying out printed circuit boards 10. This station preferably has a dispenser station (not shown) with a stack magazine for storing the soldered printed circuit boards 10 properly for transport. The printed circuit boards 10 or stack magazine 12 may be transferred between the manufacturing stations described above by means of handling devices, sliders, etc. which are known in the art. Naturally, discharge arrangement 36 may be followed by additional manufacturing stations for processing the printed circuit boards.

The manufacturing steps in the procedure according to the invention will be explained below based on an embodiment.

The printed board assemblies 10 arranged one over the other in stack magazine 12 are conveyed from feed station 1, e.g. by way of a roller belt, into discontinuously operated process chamber 2, wherein the lock on the side of the feed station consists of a chamber door 16, which may be lifted in the figure. Process chamber 2 is sealed vacuum-tight by lowering chamber door 16 and brought to a process pressure, e.g. of 100 Pa, by means of a vacuum pump 18, during which a gas atmosphere consisting of 95 parts by volume $H_2$ and a volume percent of $CH_4$ is present in process chamber 2. The advantage to the low-pressure plasma procedure is that the free path lengths of the gas molecules are so high due to the applied vacuum that the plasma already forms at process temperatures of between 60° and 100° C., thereby preventing heat damage to the printed circuit boards. The process gas mixture is converted into an ionized state by the magnetron, during which frequencies in the gigahertz range (microwave) are preferably used. The formed gas plasma consists of uncharged molecules, ions and radicals of the process gas, which enter into chemical reactions with the surface of the joints as described above, or "knock out" particles from the surface of the printed circuit board via pulse transmission. Passive and oxide layers which formed on the strip conductors and components are removed in this way. The associated increase in solderability eliminates the need for using fluxing agents for this purpose, or at least enables the use of fluxing agents which contain fewer solids. The gas plasma gets into all gaps in excellent fashion, so that even poorly accessible sections of the printed board assembly 10 are reached.

The reaction products are sucked off by vacuum pump 18, and process chamber 2 is continuously supplied with newly prepared process gases. Plasma treatment concludes after an exposure time of, for example, 1.5 min, after which the supply of process gas is interrupted, existing process gases are pumped out and process chamber 2 is ventilated. Following plasma pretreatment, chamber doors 16, 17 are lifted and opened, and conveying system 6 transports the treated stack magazine through the chamber door 17 on the side of the soldering machine into temporary storage tank 3, while the next stack magazine 12 is supplied by way of feed station 1.

In temporary storage tank 3, printed circuit boards 10 are brought to a temperature suite for subsequent soldering, individually removed from the stack by dispenser 22 and fixed into position in the receptacles 26 of conveyor belt 24, which transports the boards past preheating system 28 to double-wave soldering arrangement 4. In this soldering arrangement, the solder is applied in a way known in the art, so that the components are soldered with the printed circuit boards.

In the arrangement according to the invention, a heated protective gas is blow onto the printed circuit board 2 to be soldered after the second wave 32 by means of slit die 34, giving rise to a protective gas zone 38, a so-called "protective gas cushion", bordered by the back of second wave 32 and the surface of the printed circuit boards. This protective gas zone provides an additional safeguard against undesired solder bridge formation. Since in particular wave soldering arrangements are associated with the danger of solder bridge formation, it is advantageous to use the "protective gas cushion" described above for such systems in order to achieve a qualitatively flawless soldered joint in this way without using fluxing agents.

Following the double-wave soldering arrangement 4, the printed board assembly 10 is removed by a discharge arrangement 36 and carried away for further treatment or storage.

The efficiency of plasma pretreatment was shown to decrease only negligibly even after the expiration of a prolonged period of several hours, so that the actual soldering process need not immediately follow the plasma treatment. As a result, the procedure according to the invention is not limited to use in on-line production. Instead, it is also possible to execute the plasma pretreatment and actual soldering process at separate locations, temporarily storing the printed board assemblies, or to subject the individual joints, i.e. the printed circuit board and electronic components in this case, to plasma treatment separately, temporarily store the joints pretreated with plasma and, if necessary, assemble and solder them. For example, the new procedure makes it possible to keep the plasma-treated joints under a protective gas in suitable receptacles to prevent contamination, and to introduce another manufacturing step, e.g. assembly under a protective gas or soldering, only after a prolonged storage or transport in the receptacle.

In the embodiment described above, process chamber 2 is operated discontinuously, However, use may also be made of an integrated soldering arrangement with a continuously operated single-pass process chamber with a continuous lock system.

For the sake of simplicity, the same reference marks are used for the corresponding components in the first and second embodiments.

Figure 2:
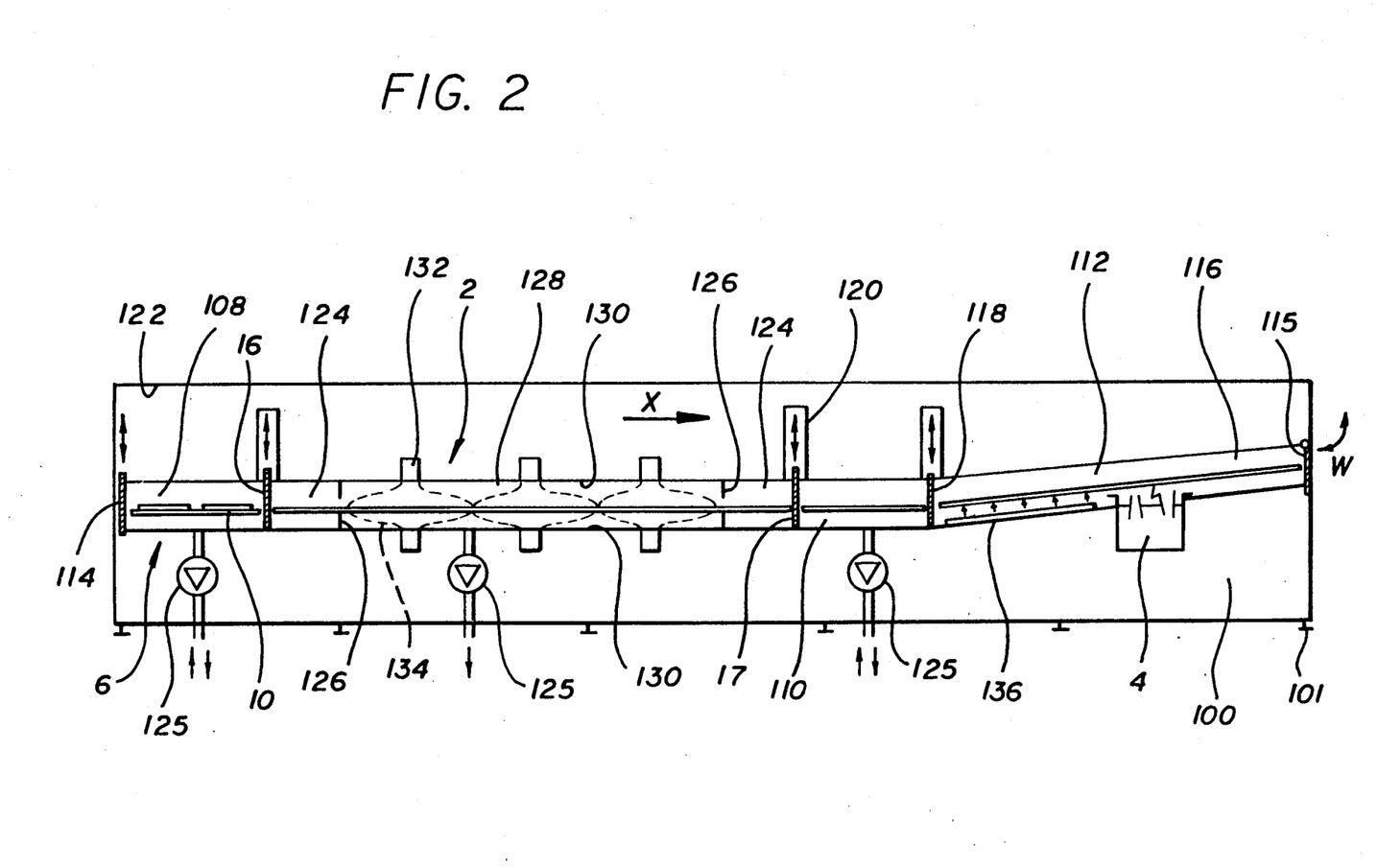
FIG. 2 is a second embodiment of an arrangement for processing printed board assemblies, and on FIG. 3 is a partial view of the arrangement from FIG. 2.

In a continuously operated system of the kind shown in FIG. 2, a conveying system 6 carrying printed circuit boards 10 passes through a tunnel 100, which houses a first evacuation chamber 108, a process chamber 2, a second evacuation chamber 110, a protective gas tunnel 112 and a soldering arrangement 4, all arranged one after the other in conveying direction X.

The tunnel is supported on a suitable base by numerous adjustable support foots 101. The adjustability of the support foots makes it possible to horizontally align tunnel 100, and therefore the entire integrated soldering system. In the embodiment shown, the conveying system in the area of evacuation chambers 108,110, process chamber 2 and soldering arrangement 4 consists of separate transport arrangements which carry printed circuit boards 10 by means of auxiliary frames (not shown). These auxiliary frames may already be used in preceding steps, e.g. during transport or while assembling the printed circuit boards. The individual transport arrangements are controlled by control units arranged over these arrangements, which ensures a continuous passage of printed circuit boards 10 through process chamber 2.

As already mentioned in the first embodiment, conveying system 6 will not be described in any detail, since use may be made of commercially available systems which are already known in the art.

The inlet and outlet of tunnel 100 may be locked with an inlet gate 114 and outlet gate 115. Inlet gate 114 is preferably designed as a vacuum-tight lock, while outlet gate 115 consists of a drop gate which may be pivoted upward in the direction of arrow W. The requirements placed on the outlet gate with respect to tightness need not be as stringent as those for inlet gate 114, since there is a protective gas atmosphere in the outlet area 116 of tunnel 100 having a pressure within the ambient pressure range, and a small loss of protective gas may be tolerated.

Process chamber 2 may be sealed from the first evacuation chamber 108 or second evacuation chamber 110 in a vacuum-tight manner by lock gates 16,17, which may preferably be moved in a vertical direction. The second evacuation chamber may be sealed from protective gas tunnel 112 and soldering arrangement 4 in a vacuum-tight manner by means of an outlet lock gate 115. In the embodiment shown, lock gates 16, 17, 115 and 118 are opened vertically upward, and are each guided in guide sections 120 of a tunnel hood 122.

A vacuum pump 125 is connected to the first and second evacuation chamber 108,110 and process chamber 2, and may be used to evacuate the respectively connected chamber 108,2,110, e.g. to the process pressure of 30 to 40 Pa. In addition, each of the aforementioned chambers 108,2,110 is equipped with a ventilation system in order to bring the chamber volume from a vacuum to ambient pressure, or to a pressure within the ambient pressure range.

Vacuum pumps 125, in particular those in process chamber 2, may be hooked up to a gas cleaning system (not shown), e.g. one equipped with an adsorber, so that the process gases may be used in the circulation. This makes it possible to remove reactive process gases or other impurities, thereby remaining in compliance with strict regulations, e.g. those of the TA for air.

Ventilation, in particular of evacuation chambers 108,110, can take place with a protective gas, e.g. $N_2$. In many applications, it is sufficient to only ventilate the second evacuation chamber 110 with protective gas while ventilating the first evacuation chamber 108 with ambient air. Process chamber 2 is routinely ventilated only after turning off the integrated system.

The capacity of evacuation chambers 110,108 ensures a continuous utilization of process chamber 2 and soldering arrangement 4.

Process chamber 2 contains a relaxation zone 124 in the area of locks 16,17, This relaxation zone is separated from the actual plasma treatment chamber 128 by a wall 126 open in the area of conveying system 6. Wall 126 prevents the process gas from streaming into evacuation chambers 110,108 without hindrance when lock gates 16,17 are open. This makes it possible to achieve an essentially uniform process gas concentration in plasma treatment chamber 128 viewed in transport direction X. In addition, the temperature of printed circuit boards 10 in relaxation zones 124 is evened out.

As in the first embodiment, the process chamber 2 shown on FIG. 2 is jacketed with quartz glass. Magnetrons 132 used to introduce the high-frequency energy for generating the gas plasma are arranged parallel to conveying system 6 in the upper and lower covering surface 130 of plasma treatment chamber 128.

Figure 3:
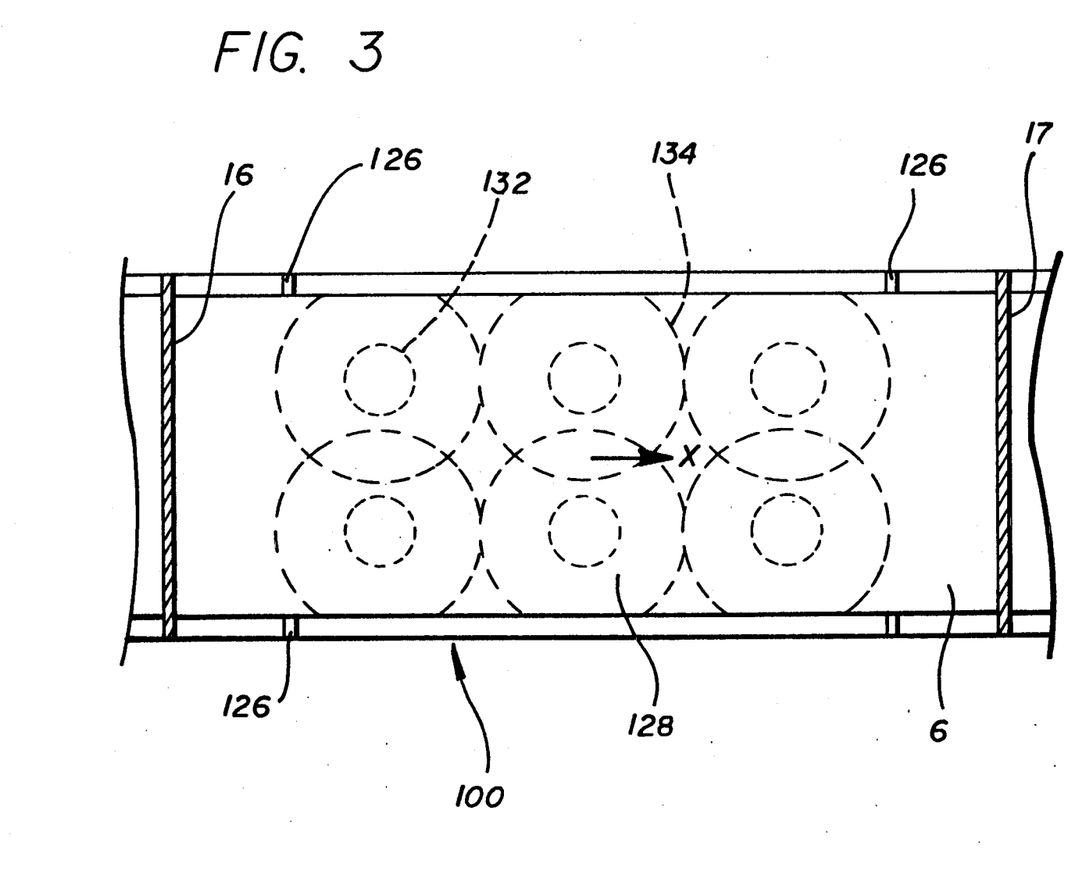

In FIG. 3, magnetrons 132 are distributed over the horizontal cross section of plasma treatment chamber 128 in such a way that a largely uniform distribution of gas plasma may be achieved. Two rows each with three magnetrons 132 arranged one after the other in transport direction X are provided on covering surfaces 130 in the embodiment shown. Of course, magnetrons 132 may be also be distributed in a different manner depending on the operating conditions.

Plasma chamber 128 advantageously has as flat a design as possible to minimize the process gas volume in the vertical direction. The distance between covering surfaces 130 and conveying system 6 or, more precisely, the large surfaces of printed circuit board 10, is selected in such a way that the effective areas 134 of the adjacent magnetrons 132 (see dashed lines on FIG. 2) combine to form an area which covers nearly the entire surface. This produces an optimal effect of the gas plasma at a minimal gas volume. Even if effective areas 134 do not extend over the entire treated surface, then still ensure a sufficient plasma treatment of the printed board assemblies 10. This is because the transport movement of printed circuit boards 10, the reflection in process chamber 2 and the pulse transmission between the ions of the process gas together ensure a uniform treatment of joints with gas plasma over the surface of a printed circuit board.

FIGS. 2 and 3 do not show the gas connections used to introduce the process gas into process chamber 2, or the heating arrangements with which process chamber 2 is brought to the process temperature.

The second evacuation chamber 110 is connected to protective gas tunnel 112, which has a protective gas atmosphere, e.g. with a slight $N_2$ overpressure, so that no ambient air can get into this section through the outlet gate. If necessary, use may be made of a preheating system 136, which brings the plasma-treated printed board assemblies 10 to a suitable temperature for the soldering process in soldering arrangement 4 in order to prevent heat damage to the printed circuit boards due to excessively rapid heating (thermal shock) in the soldering bath. Preheating system 136 can consist of infrared emitters arranged in a section of the protective gas tunnel spaced parallel to conveying path 6.

In the embodiment shown, a double-wave soldering arrangement known in the art which was already described in the first embodiment is used as the soldering arrangement. This double-wave soldering arrangement may also have a protective gas inflating station with slit die (not shown). As described in connection with the first embodiment, a solder bridge may be largely prevented with this protective gas inflating station.

In the following, the most important procedural steps for processing printed circuit boards with an arrangement according to FIGS. 2 and 3 will be described.

Presuming an operable soldering arrangement 4, the closed process chamber 2 is evacuated by means of vacuum pump 125 before initiating production, and the process gas inside process chamber 2 is converted into a plasma state. The printed circuit board 10 to be soldered or, as shown on FIG. 2, numerous printed circuit boards 10 are conveyed through the opened inlet gate 114 into the first evacuation chamber 108. This chamber is evacuated to the process pressure with the inlet gate 114 closed, so that the process gas in process chamber 2 does not become contaminated by ambient air upon opening lock gate 16, and the pressure inside the process chamber remains constant. After lock gate 16 has been opened, printed circuit board 10 passes through relaxation zone 124, in which the printed circuit board is treated with the process gas and heated to the process temperature.

While printed circuit board 10 is in relaxation zone 124, lock 16 is closed again and the first evacuation chamber 110 is ventilated, e.g. with ambient air, so that a new printed circuit board 10 may be transported through inlet gate 114 into tunnel 100.

In the meantime, the printed circuit board 10 arranged on a carrying frame was conveyed through wall 126 into plasma treatment chamber 128. Even though walls 126 do not separate relaxation zones 124 from plasma treatment chamber 128 in a gas-tight manner, the gas plasma generated by magnetrons 132 is essentially located in plasma treatment chamber 128, so that the actual plasma treatment takes place in this chamber.

After passing through plasma treatment chamber 128, printed circuit board 10 travels through wall 126 into relaxation zone 124 on the outlet side, which is also largely free of gas plasma. The reactions with the metallic surfaces of the joints triggered by the radicals of the gas plasma run to conclusion in relaxation zone 124 on the outlet side, and the printed circuit board temperature evens out.

Before the treated printed circuit board 10 passes through lock 17 and into the second evacuation chamber 110, the latter chamber is evacuated to the process pressure. After printed circuit board 10 has entered the second evacuation chamber 110, lock gate 17 is closed, and the second evacuation chamber 110 is ventilated, preferably with protective gas.

After outlet lock gate 118 has been opened, printed circuit board 10 is conveyed through protective gas tunnel 112 to double-wave soldering arrangement 4, in which the joints are soldered together. The preheating system 136 of protective gas tunnel 112 heats printed circuit board 10 to the preheating temperature for the soldering process, if necessary. At sufficiently high process temperatures, this preheating process need not be executed, since printed circuit boards 10 are sufficiently heated by the plasma treatment alone.

In the meantime, outlet lock gate 118 is closed, and the second evacuation chamber 110 is evacuated, so that the process gas in process chamber 2 does not become contaminated and the process pressure does not change when lock gate 17 is opened the next time.

The second evacuation chamber 110 and protective tunnel 112 ensure that only a negligible share of atmospheric oxygen can get into the tunnel area between soldering arrangement 4 and process chamber 2, which prevents the metallic surface of the joints (printed circuit board, electric components) from becoming reoxidized.

The soldered printed circuit boards 10 exit tunnel 100 through outlet area 116 and outlet gate 115, and are conveyed to the next processing stage, e.g. by a transfer station (not shown).

Let it be further noted that, when using non-reactive process gases, it is not necessary to evacuate evacuation chambers 108 and 110 and clean the gas with the vacuum pumps 125 connected thereto.

As already mentioned, use may also be made of a soldering arrangement which operates according to another principle instead of the double-wave soldering arrangement, e.g. a reflow soldering arrangement.

In conclusion, let it be expressly emphasized once more that the arrangements shown on FIGS. 1 to 3 and the procedure described above are, of course, not limited to the processing of printed board assemblies. Rather, any joints to be soldered together may be processed.

Finally, laboratory tests in a discontinuously operated process chamber will be used to describe the influence of plasma pretreatment on the soldering terminal surfaces of components on pluggable printed-board assemblies with THM, COB and SMD components.

Components with a melting metallurgical SnPb layer were selected from an ageing spectrum for analyzing the efficiency of plasma pretreatment, so that the natural oxide layer thickness relation could be evaluated.

The THM designs were fixed in position in a form-fitting manner on a printed circuit board layout correctly adapted for wave soldering. The SMD designs were fixed in position by means of an SMD adhesive, and the total module was annealed at 120 C. for 5 min to set the adhesive. A procedure which absolutely must be taken into consideration with respect to an additive passive layer formation, especially since escaping portions of the solvent in the adhesive or excess adhesive can contribute to an unintended passivation of soldering terminal surfaces.

In pure SMD modules or COB/SMD modules, fixing the components into position with an adhesive is not absolutely necessary if a sufficient quantity of solder is available for making the joint, and the modules or pad have structural elements of component fixing.

The modules consisting of mixed component sets or SMD only are then subjected to plasma pretreatment. Process durations varying from 2 to 20 min were examined as the pretreatment time in a pure $H_2$ plasma atmosphere at a plasma pressure of 100 Pa and a power density of approx. 0.8 $W/cm^2$.

In addition, use was made of a plasma atmosphere consisting of 95 parts by volume of $H_2$ / 5 parts by volume of $CH_4$, with a process duration of 2 to 10 min, a process pressure of 100 Pa and a power density of 0.6 $W/cm^2$. The pluggable printed-board assemblies were processed via soldering immediately after pretreatment and after a buffer time of 20 min between the plasma pretreatment and soldering process. The visual diagnosis was coupled with a 20 X-ray transmission analysis, so that the joint zones in the component connection area could be sufficiently and clearly evaluated. As may be certified by executing an immersion test specifically conceived for wave soldering (Solder LSn63), a 100 mm capillary penetration of the solder itself into the gaps is ensured, the formation of a meniscus topology reveals a good wetting behavior, and the freedom from defects in the metallization/solder interface reaches at least the level encountered for conventional wave soldering with the use of fluxing agents.

In this case, the described plasma pretreatment of the pluggable printed-board assemblies ensures that the throughplating of the printed circuit board or capillaries for the pluggable component connection are homogeneously and correctly filled with solder.

The result of destructive tests also serves as an indicator of bond quality. Faulty wetting can only be expected in areas where an adhesive point which was oversized for fixing the design into position has prevented soldering terminal surfaces from undergoing plasma pretreatment. Damage to masking materials and molds of the components stemming from plasma pretreatment according to the invention either are not to be expected, or were not determined.

We claim:

1. A procedure for processing joints to be soldered, characterized by the fact that at least one joint is subjected to plasma pretreatment with a process gas before the soldering process, said process gas being selected from the group consisting of noble gases, $H_2$, alkyl forming gas, or a mixture thereof at a process pressure of less than $2 \cdot 10^4$ Pa, and a plasma power density of more than 0.1 $W/cm^2$, a process temperature of less than 180° C. a process duration of more than 10 seconds.

2. A procedure according to claim 1, characterized by the fact that use is made of a process gas consisting of 100 to 80 parts by volume of $H_2$ and 0 to 20 parts by volume of an alkyl-forming gas.

3. A procedure according to claim 1, characterized by the fact that use is made of a process gas consisting of 100 to 80 parts by volume of $H_2$ and a total of 0 to 20 by volume of an inert gas and alkyl-forming gas.

4. A procedure according to claim 3, characterized by the fact that use is made of a process gas consisting of 95 parts by volume of $H_2$ and 5 parts by volume of $CH_4$.

5. A procedure according to claim 1, characterized by the fact that use is made of a low-pressure plasma at a process pressure of 10 to 200 Pa, a plasma power density of 0.5 to 0.8 $W/cm^2$, a process gas volumetric flow rate of between 1 and 5000 ml/min, a process temperature of between 60° and 100° C. and a process duration of between 30 s and 10 min.

6. A procedure according to one of claims 1, 2, 3, 4 or 5, characterized by the fact that the joints are brought into a predetermined relative position to each other before plasma treatment.

7. A procedure according to claim 1 characterized by the fact that the joints are temporarily stored after plasma treatment.

8. A procedure according to claim 7, characterized by the fact that temporary storage takes place under a protective gas atmosphere.

9. A procedure according to claims 7 or 8, characterized by the fact that the joints are thermostated during temporary storage.

10. A procedure according to claim 6, characterized by the fact that the joints are soldered together in a step which immediately follows plasma treatment.

11. A procedure according to claim 10, characterized by the fact that plasma treatment heats the joints to a preheating temperature suited for the soldering process.

12. A procedure according to claims 10 or 11, characterized by the fact that joints (10) are treated with a protective gas between the plasma treatment and soldering process.

13. A procedure according to claim 1, characterized by the fact that the joints are subjected to plasma treatment in a closed process chamber (2) operated in stages.

14. A procedure according to claim 1, characterized by the fact that the joints are subjected to plasma treatment in a continuously operated process chamber (2).

15. A procedure according to claim 1, characterized by the fact that a printed circuit board (10) and at least one electronic component are used as the joints.

16. A procedure according to claim 15, characterized by the fact that the components and printed circuit boards are subjected to plasma pretreatment on purely SMD modules or mixed COB/SMD component set modules, wherein the components are fixed into position with adhesives on raised SnPb layers or profiled and raised SnPb layers on the soldering terminal surfaces of the printed circuit board in the case of SMDs, and via design measures in the joint zone in the case of COBs.

17. A procedure according to claim 16, characterized by the fact that a plurality of joints (1) are simultaneously subjected to plasma treatment in process chamber (2).

18. Apparatus for processing joints to be soldered comprising: a soldering arrangement (4), a process chamber (2) for subjecting the joints to plasma pretreatment, and a conveying system for conveying said joints from said process chamber to said soldering arrangement.

19. An arrangement according to claim 18, characterized by the fact that the process chamber is a low-pressure process chamber (2).

20. An arrangement according to claim 18 or 19, characterized by locks (16, 17) for locking said process chamber (2).

21. An arrangement according to claim 20, characterized by the fact that process chamber (2) has a temporary storage tank for holding the plasma-treated joints (10), from which the joints are fed to soldering arrangement (4).

22. An arrangement according to claim 21, characterized by the fact that process chamber (2) has a temporary storage tank (108) for holding the joints (10) to be treated in process chamber (2).

23. An arrangement according to claim 21, characterized by the fact that the first and second temporary storage tank (110,108) are each separated from process chamber (2) by a first (16,17), and second (114,118) locks.

24. An arrangement according to claim 18, characterized by the fact that a plurality of high-frequency generators (132) for generating the gas plasma are arranged on covering surfaces (130) of process chamber (2), so that the joints are treated in essentially a uniform manner with the gas plasma.

25. An arrangement according to claim 24, characterized by the fact that high-frequency generators (132) are spaced parallel to the lower and/or upper larges surfaces of joints (10).

26. An arrangement according to claim 23, characterized by the fact that the first and second temporary storage tanks (110,108) are each evacuated and ventilated by means of a vacuum pump (125).

27. An arrangement according to claim 26, characterized by the fact that the first temporary storage tank (110) and/or the second temporary storage tank (108) is ventilated with protective gas.

28. An arrangement according to claim 21, characterized by the fact that a protective gas tunnel (112) through which the joints are supplied to soldering arrangement (4) follows the first temporary storage tank (110).

29. An arrangement according to claim 28, for processing printed board assemblies (10), characterized by the fact that process chamber (2) and soldering arrangement (4) are arranged in a shared through tunnel (100), through which printed board assemblies (10) is conveyed by means of a shared conveying system (106), and whose inlet and outlet openings is sealed by means of an inlet or outlet gate (114,115).

30. An arrangement according to claim 29, characterized by the fact that the first temporary storage tank (110) is arranged in through tunnel (100).

31. An arrangement according to claim 30, characterized by the fact that the second temporary storage tank (108) is arranged in through tunnel (100).

32. An arrangement according to claim 31, characterized by the fact that the protective gas tunnel (112) is arranged in through tunnel (100).

33. An arrangement according to claim 29, characterized by the fact that the section on the inlet and outlet side of process chamber (2) viewed in transport direction (X) is designed as a relaxation zone (124), in which no energy input takes place.

34. An arrangement according to claim 29, characterized by the fact that each printed circuit board (10) is positioned on an auxiliary frame of conveying system (106) during transport.

35. An arrangement according to claim 18, characterized by a stack magazine (12) for holding a plurality of joints to be soldered, said conveying system transferring said stack magazine from said process chamber a position for transferring joints (10) to said soldering arrangement.

36. An arrangement according to claim 18, characterized by means at said soldering arrangement for treating the sections of joints (10) wetted by the solder with a protective gas.

37. An arrangement according to claim 18, characterized by the fact that soldering arrangement (4) is a double-wave soldering arrangement.

38. An arrangement according to claim 18, characterized by the fact that soldering arrangement (4) is a reflow soldering arrangement.

39. A procedure for processing joints, printed board assemblies, to be soldered, characterized in that at least one joint is subjected to plasma pretreatment with a process gas before the soldering process, the process gas is a substance selected from the group consisting of $O_2$, $H_2$, $Cl_2$, $N_2O$, $N_2$, $CF_4$, fluorocarbons or a combination of several of these substances, use is made of a low pressure plasma at a process pressure of less than $2 \cdot 10^4$ Pa, a plasma power density of more than 0.1 W/cm$^2$, a process temperature of less than 180° C. and a process duration of more than 10 seconds, the joints (10) are brought into a predetermined relative position to each other before plasma treatment, the joints (10) are soldered together in a step which immediately follows plasma treatment, joints (10) are treated with a protective gas between the plasma treatment and the soldering process, the joints (10) are subjected to plasma treatment in a continuously operated process chamber (2), and that a printed circuit board (10) and at least one electronic component are used as the joints.

40. A procedure for processing joints, printed board assemblies, to be soldered, characterized in that at least one joint is subjected to plasma pretreatment with a process gas before the soldering process, the process gas is a substance selected from the group consisting of inert gases, $H_2$ and alkyl-forming gas or a combination of several of these substances, use is made of a low-pressure plasma for pretreating the joints (10) with plasma at a process pressure of less than $2 \cdot 104$ Pa, a plasma power density of more than 0.1 w/cm$^2$, a process temperature of less than 180° C. and a process duration of more than 10 seconds, the joints are brought into a predetermined relative position to each other before plasma treatment, the joints (10) are soldered together in a step which immediately follows plasma treatment, the joints (10) are treated with a protective gas between the plasma treatment and soldering process, the joints (10) are subjected to plasma treatment in a continuously operated process chamber (2), and that a printed circuit board (10) and at least one electronic component are used as joints.

41. An arrangement for processing joints, printed board assemblies, to be soldered comprising a soldering arrangement (4) and a low pressure process chamber (2) allocated to this soldering arrangement for subjecting the joints to plasma pretreatment, whereby said process chamber (2) having a first temporary storage tank (110) for holding the plasma-treated joints (10), from which the joints are fed to said soldering arrangement (4), said process chamber (2) having a second temporary storage tank the joints (10) are brought into a predetermined (108) for holding the joints (10) to be treated in said process chamber (2), said first and second temporary storage tanks (110, 108) are each separated from each process chamber (2) by first (16, 17) and (114, 118) locks, a plurality of high-frequency generators (132) for generating the gas plasma are arranged on covering surfaces (130) of process chamber (2) so that the joints are treated in essentially a uniform manner with the gas plasma, the first and/or second temporary storage tanks (110,108) are evacuated and ventilated by means of a vacuum pump (125), a protective gas tunnel (112) through the joints are supplied to soldering arrangement (4) follows the first temporary storage tank (110), the process chamber (2), the soldering arrangement (4), the first temporary storage tank (110), the second temporary storage tank (108) and the protective gas tunnel (112) are arranged in a shared through tunnel (100), through which printed board assemblies (10) are conveyed by means of a shared conveying system (106), and whose inlet and outlet openings are sealed by means of an inlet or outlet gate (114,115), the section on the inlet and outlet side of process chamber (2) viewed in transport direction (X) is designed as a relaxation zone (124), in which no energy input takes place, each printed circuit board (20) being positioned on an auxiliary frame of conveying system (106) during transport, and the soldering arrangement (4) is a double-wave soldering arrangement.

* * * * *